United States Patent
Kim et al.

(10) Patent No.: US 9,389,515 B2
(45) Date of Patent: Jul. 12, 2016

(54) PHOTORESIST RESIN COMPOSITION AND METHOD OF FORMING PATTERNS BY USING THE SAME

(71) Applicant: SAMSUNG DISPLAY CO., LTD., Yongin, Gyeonggi-Do (KR)

(72) Inventors: Jeong Won Kim, Suwon-si (KR); Jin Ho Ju, Seoul (KR); Jong Kwang Lee, Daejeon (KR); Min Kang, Seoul (KR); Tae Gyun Kim, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/677,823

(22) Filed: Apr. 2, 2015

(65) Prior Publication Data

US 2015/0212422 A1    Jul. 30, 2015

Related U.S. Application Data

(62) Division of application No. 13/224,935, filed on Sep. 2, 2011, now Pat. No. 9,017,925.

(30) Foreign Application Priority Data

Mar. 22, 2011    (KR) ........................ 10-2011-0025286

(51) Int. Cl.

| | |
|---|---|
| *G03F 7/027* | (2006.01) |
| *G03F 7/40* | (2006.01) |
| *G03F 7/022* | (2006.01) |
| *G03F 7/023* | (2006.01) |
| *G02F 1/1343* | (2006.01) |
| *G03F 7/30* | (2006.01) |

(52) U.S. Cl.
CPC .............. *G03F 7/40* (2013.01); *G02F 1/13439* (2013.01); *G02F 1/134309* (2013.01); *G03F 7/023* (2013.01); *G03F 7/0226* (2013.01); *G03F 7/30* (2013.01)

(58) Field of Classification Search
USPC ................................................ 430/325, 281.1
See application file for complete search history.

(56) References Cited

U.S. PATENT DOCUMENTS

| | | | |
|---|---|---|---|
| 6,475,693 B1 | 11/2002 | Suskida et al. | |
| 6,991,888 B2 | 1/2006 | Padmanaban et al. | |
| 2003/0207202 A1 | 11/2003 | Fujita et al. | |
| 2010/0265422 A1* | 10/2010 | Chen et al. | 349/38 |
| 2011/0236825 A1* | 9/2011 | Park et al. | 430/270.1 |

FOREIGN PATENT DOCUMENTS

| | | |
|---|---|---|
| JP | 11-237737 A | 8/1999 |
| JP | 2004-212679 A | 7/2004 |
| JP | 2005-134800 A | 5/2005 |
| JP | 2005-308977 A | 11/2005 |
| KR | 100294649 B | 4/2001 |
| KR | 1020060002051 A | 1/2006 |
| KR | 100846085 B1 | 7/2008 |
| KR | 1020090027522 A | 3/2009 |

* cited by examiner

*Primary Examiner* — Daborah Chacko Davis
(74) *Attorney, Agent, or Firm* — Innovation Counsel LLP

(57) ABSTRACT

A method for forming a pattern includes forming a photosensitive film by coating a photosensitive resin composition on a substrate, exposing the photosensitive film to light through a mask that includes a light transmission region and a non-light transmission region, coating a developing solution on the photosensitive film, and forming a photosensitive film pattern by baking the photosensitive film, wherein the photosensitive resin composition includes an alkali soluble base resin, a photoacid generator and a photoactive compound.

8 Claims, 9 Drawing Sheets

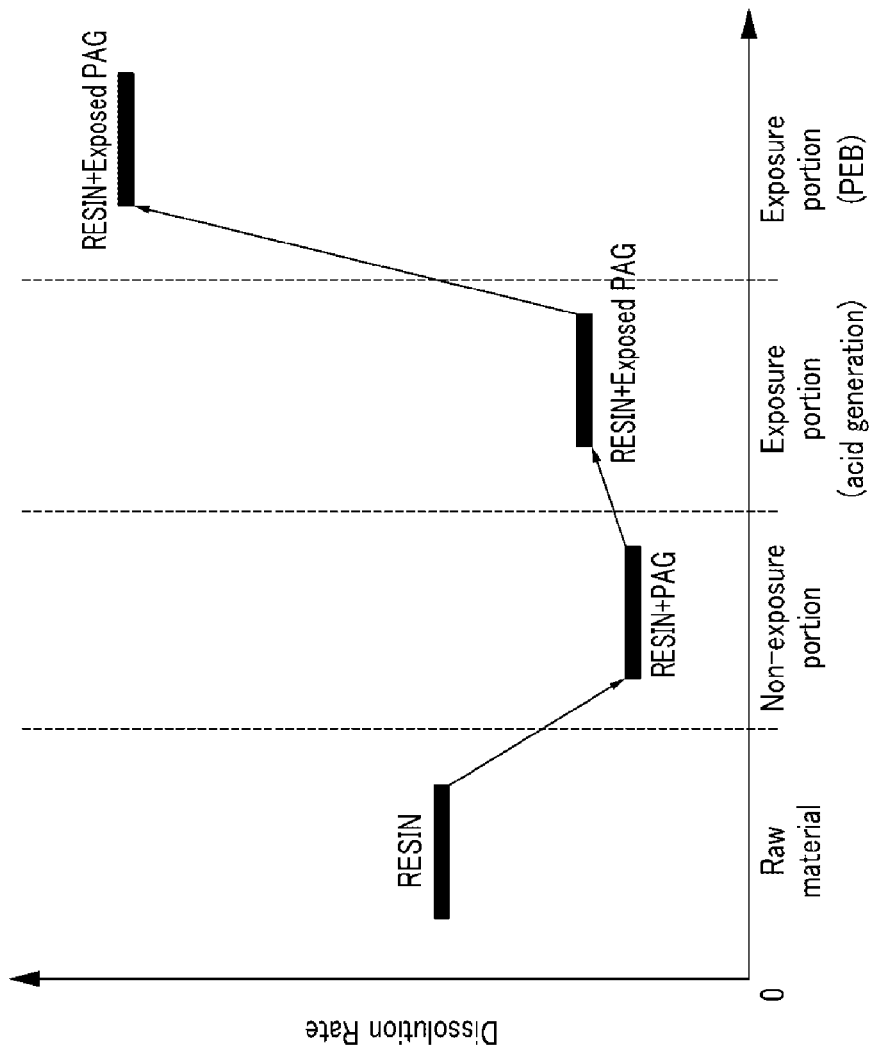

PHOTORESIST RESIN COMPOSITION AND METHOD OF FORMING PATTERNS BY USING THE SAME

CROSS-REFERENCE TO RELATED APPLICATION

This application is a divisional application of U.S. patent application Ser. No. 13/224,935 filed on Sep. 2, 2011, which claims priority to and the benefit of Korean Patent Application No. 10-2011-0025286 filed in the Korean Intellectual Property Office on Mar. 22, 2011, and all the benefits accruing therefrom under 35 U.S.C. §119, the contents of the prior applications being herein incorporated by reference.

BACKGROUND OF THE INVENTION (a) Field of the Invention

A photosensitive resin composition and a method for forming a pattern by using the same are provided.

(b) Description of the Related Art

Display devices such as a liquid crystal displays (LCD) and organic light emitting diode displays include a plurality of thin films such as a conductive layers, a semiconductor layer and insulating layers.

In a thin film transistor array panel, a gate conductive layer, a semiconductor layer, a data conductive layer, and additional thin films such as a pixel electrode layer may be formed, and these thin films are usually patterned by using photolithography. Photolithography is a method for etching thin films that uses a mask. The etchant etches areas not covered by the mask to form a pattern in the thin film. The mask is formed by exposing and developing a photosensitive film that is coated on the thin film, to form a pattern having a predetermined shape in the photosensitive film. The photosensitive film may include a photosensitive resin composition.

Methods for finely patterning thin films have been studied in order to improve the quality of display devices. In order to finely pattern a thin film, the photosensitive film needs to be finely patterned. Whether or not a photosensitive film is capable of being finely patterned is largely determined by the compounds that form the photosensitive resin composition.

The above information disclosed in this Background section is only for enhancement of understanding of the background and therefore it may contain information that does not form the prior art that is already known to a person of ordinary skill in the art.

SUMMARY OF THE INVENTION

A photosensitive resin composition including an alkali soluble base resin, a photoacid generator, a photoactive compound, and a phenol-based compound including a hydrophobic group is provided.

The phenol-based compound may be a compound represented by the following Formula 1.

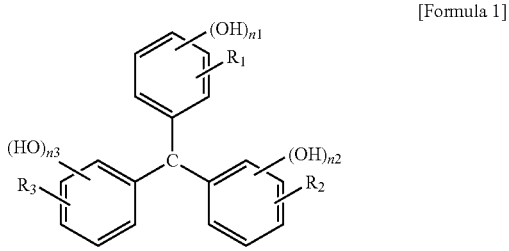

[Formula 1]

wherein $R_1$ to $R_3$ are independently a substituted or unsubstituted $C_1$-$C_{10}$ alkyl group, and n1 to n3 are independently an integer of 1 to 5.

The alkali soluble base resin may be a tandem type resin.

The tandem type resin may include a high molecular weight resin, a low molecular weight resin, and a medium molecular weight resin, and the medium molecular weight resin may be included in a smaller amount than each of the high molecular weight resin and the low molecular weight resin. The high molecular weight resin may have a molecular weight of about 5000 g/mol or more, the low molecular weight resin may have a molecular weight of about 500 g/mol or less, and the medium molecular weight resin may have a molecular weight of about 500 g/mol to about 5000 g/mol.

The base resin may be about 100 parts by weight, the photoacid generator may be about 0.01 to about 20 parts by weight, the photoactive compound may be about 0.1 to about 30 parts by weight and the phenol-based compound may be about 0.01 to about 20 parts by weight.

In another aspect, a method for forming a pattern is provided, the method including: forming a photosensitive film by coating a photosensitive resin composition on a substrate, exposing the photosensitive film to light through a mask, the mask including a light transmission region and a non-light transmission region, coating a developing solution on the photosensitive film, and forming a photosensitive film pattern by baking the photosensitive film, wherein photosensitive resin composition includes an alkali soluble base resin, a photoacid generator and a photoactive compound.

The photosensitive film pattern may have a rectangular cross-section.

The method for forming the pattern may further include forming a thin film on the substrate. The thin film may be a pixel electrode of a liquid crystal display, and the pixel electrode may include a fine branch electrode.

A width of the fine branch electrode may be about 2 μm or less.

The photosensitive resin composition may further include a phenol-based compound including a hydrophobic group.

According to the method, it is possible to finely pattern a thin film and improve transmittance of a display device by finely patterning a pixel electrode.

BRIEF DESCRIPTION OF THE DRAWINGS

FIG. 2B is a solubility with respect to a developing solution of a known photosensitive resin composition for each step of a pattern forming process.

DETAILED DESCRIPTION OF THE EMBODIMENTS

Figure 1A:
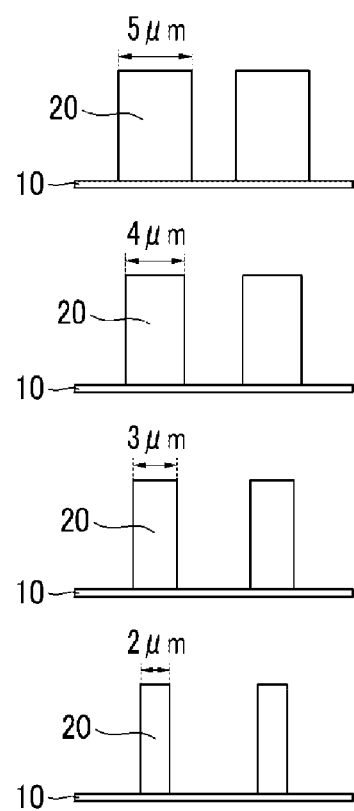
FIG. 1A is a view schematically illustrating a photosensitive film pattern according to an exemplary embodiment.

Exemplary embodiments will be described more fully hereinafter with reference to the accompanying drawings, in which exemplary embodiments are shown. As those skilled in the art would realize, the described embodiments may be modified in various different ways, all without departing from the spirit or scope of the present invention. The drawings and description are to be regarded as illustrative in nature and not restrictive. Like reference numerals are used to designate like elements throughout the specification. Furthermore, detailed description of widely known technology will be omitted.

In the drawings, the thickness of layers, films, panels, regions, etc., are exaggerated for clarity. It will be understood that when an element such as a layer, film, region, or substrate is referred to as being "on" another element, it may be directly on the other element, or intervening elements may also be present. In contrast, when an element is referred to as being "directly on" another element, there are no intervening elements present. It will be understood that when an element such as a layer, film, region, or substrate is referred to as being "beneath" another element, it may be directly beneath the other element, or intervening elements may also be present. In contrast, when an element is referred to as being "directly beneath" another element, there are no intervening elements present.

In the present specification, unless otherwise specifically stated, the term "substituted" means that a matter is substituted by halogen, a $C_1$-$C_{20}$ haloalkyl group, a $C_1$-$C_{20}$ alkyl group, a $C_1$-$C_{20}$ alkoxy group, a $C_6$-$C_{30}$ aryl group, or a $C_6$-$C_{30}$ aryloxy group.

Figure 1B:
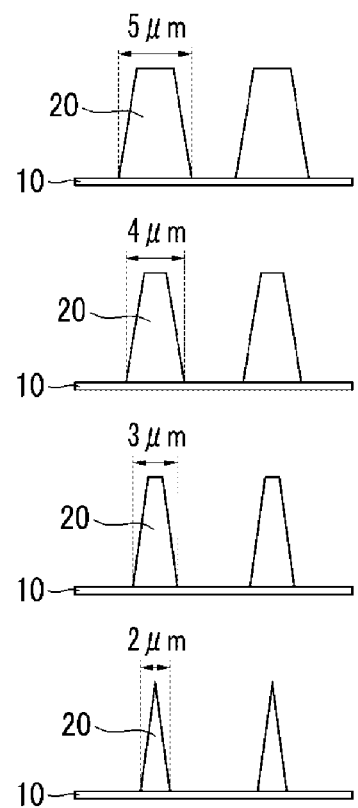
FIG. 1B is a view schematically illustrating a known photosensitive film pattern.
Figure 2A:
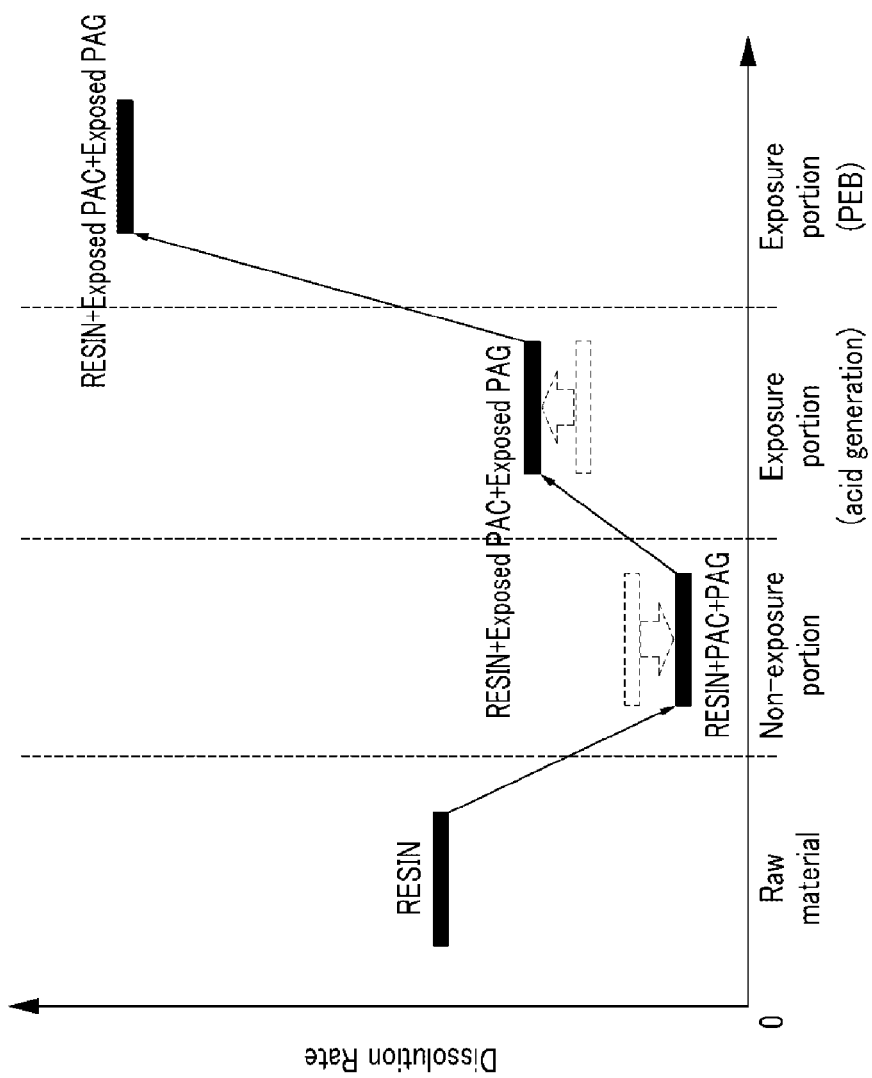
FIG. 2A is a graph illustrating solubility with respect to a developing solution of a photosensitive resin composition according to the exemplary embodiment for each step of a pattern forming process.

FIG. 1A is a view schematically illustrating a photosensitive film pattern according to an exemplary embodiment, and FIG. 1B is a view schematically illustrating a known photosensitive film pattern. FIG. 2A is a graph illustrating solubility with respect to a developing solution of a photosensitive resin composition according to the exemplary embodiment for each step of a pattern forming process, and FIG. 2B is a graph illustrating solubility with respect to a developing solution of a known photosensitive resin composition for each step of a pattern forming process.

With reference to FIG. 1A, a photosensitive film pattern 20 is disposed on a substrate 10. The substrate 10 may include plastic or glass. A thin film to be patterned may be disposed on the substrate 10. The thin film to be patterned may be, for example, a metal layer or a semiconductor layer. The photosensitive film is formed by coating the photosensitive resin composition onto the substrate 10, and the photosensitive film pattern 20 may be formed through exposure and developing processes. In FIG. 1A, a mask (not shown) is used when the photosensitive film is exposed, and the mask includes a light transmission region and a non-light transmission region (i.e., a light blocking region). The light transmission region is a region where all the light is transmitted, and the non-light transmission region is a region where light is not transmitted, but is blocked. The region where the photosensitive film pattern 20 is disposed may correspond to the non-light transmission region of the mask, and the region where the photosensitive film pattern 20 is not disposed may correspond to the light transmission region of the mask.

With reference to FIG. 1A, it may be seen that the photosensitive film pattern 20 has an approximately rectangular cross-section, and even as the width of the photosensitive film pattern 20 is decreased (from 5 μm to 2 μm), the rectangular shape of the photosensitive film pattern 20 is maintained. Accordingly, a thin film having a fine pattern may be formed by using the fine photosensitive film pattern 20. For example, a thin film pattern having a width of approximately 2 μm or less may be formed.

The method for obtaining the photosensitive film pattern 20 may be explained with reference to FIG. 2A. FIG. 2A shows the dissolution rate of a photosensitive resin film of an exemplary embodiment in four different states (which will be explained in more detail below): the resin alone; the non-exposure portion of the resin which includes a photoacid generator (PAG) and a photoactive compound (PAC); the exposure portion of the resin which includes exposed PAG and exposed PAC; and the exposure portion of the resin which includes exposed PAG and exposed PAC after a post exposure baking process. FIG. 2B, for comparison, shows the dissolution rate of a known photosensitive resin in four states: the resin alone; the non-exposure portion of the resin which includes a PAG; the exposure portion of the resign which includes PAG; and the exposure portion of the resin which includes PAG after a post exposure baking process.

The photosensitive film pattern 20 has an approximately rectangular cross-section even at very small widths because, with reference to FIG. 2A, the developing speed of the photosensitive resin composition at the non-exposure portion of the photosensitive film and the developing speed in the developing solution of the photosensitive resin composition at the exposure portion of the photosensitive film are significantly different from each other. The developing speed in the developing solution is proportional to solubility of the photosensitive resin composition in the developing solution. In other words, the non-exposure portion in the photosensitive film, which corresponds to the non-light transmission region of the mask and is therefore not exposed to light, has, as shown in FIG. 2A, a low solubility to the developing solution. Therefore, when the developing solution is coated onto the non-exposure portion of the photosensitive film, the upper part of the non-exposure portion of the photosensitive film may be only slowly developed. Accordingly, because the amount of the photosensitive film removed by the developing solution is small at the upper part of the non-exposure portion of the photosensitive film, the non-exposure portion of the photosensitive film may have an approximately rectangular cross-section. Thus, as shown in FIG. 1A, it is possible to form the photosensitive film pattern 20 having an approximately rectangular cross-section. In addition, the exposure portion in the photosensitive film, which corresponds to the light transmission region of the mask and is exposed to light has, as shown in FIG. 2A, a large solubility to the developing solution. Therefore, when the developing solution is coated onto the exposure portion of the photosensitive film, the exposure portion of the photosensitive film may be rapidly developed. Accordingly, because the amount of photosensitive film removed by the developing solution in the exposure portion is large, the exposure portion of the photosensitive film may be removed in a groove form and have an approximately rectangular cross-section.

On the other hand, referring to FIG. 1B, the photosensitive film pattern 20 in the known art has an approximately trapezoidal, and even triangular, cross-section. Because the amount of photosensitive film removed by the developing solution is large at the upper part of the non-exposure portion, as the width of the photosensitive film pattern 20 is decreased, the rectangular shape of the photosensitive film pattern 20 is not maintained. Accordingly, it is difficult to form a thin film having a fine pattern. For example, it is difficult to form a thin film pattern having a width of approximately 2 μm or less.

With reference to FIG. 2B, the photosensitive film pattern 20 has an approximately trapezoidal cross-section because the difference between the developing speed in the developing solution of the photosensitive resin composition at the non-exposure portion of the photosensitive film and the developing speed in the developing solution of the photosensitive resin composition at the exposure portion of the photosensitive film is much smaller than the case shown in FIG. 2A.

The photosensitive resin composition of the exemplary embodiments may include a base resin, a photoacid generator, a photoactive compound and a solvent. With reference to FIG. 2A, if a photoacid generator (PAG) and a photoactive compound (PAC) are added to an alkali soluble base resin, because the photoacid generator and the photoactive compound are not alkali soluble, the solubility of the photosensitive resin composition in the developing solution is decreased. Accordingly, the photosensitive film pattern 20 having the approximately rectangular cross-section may be formed, and the fine thin film may be formed.

Moreover, if a phenol-based compound that includes a hydrophobic group is added with the photoacid generator and the photoactive compound, the solubility of the photosensitive resin composition in the developing solution may be further reduced, and an even finer thin film pattern may be formed. For example, the phenol-based compound including a hydrophobic group may be a compound represented by the following Formula 1.

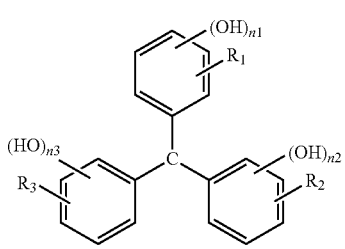

[Formula 1]

wherein $R_1$ to $R_3$ are independently a substituted or unsubstituted $C_1$-$C_{10}$ alkyl group, and n1 to n3 are independently an integer of 1 to 5.

Figure 3:
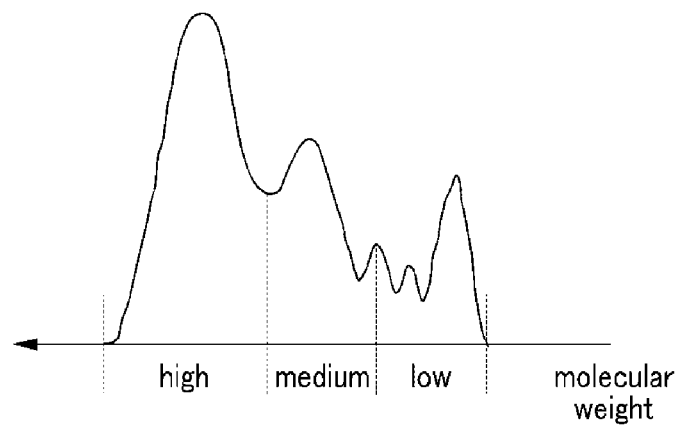
FIG. 3 is a gel permeation chromatography (GPC) graph of a base resin according to the exemplary embodiment.
Figure 4:
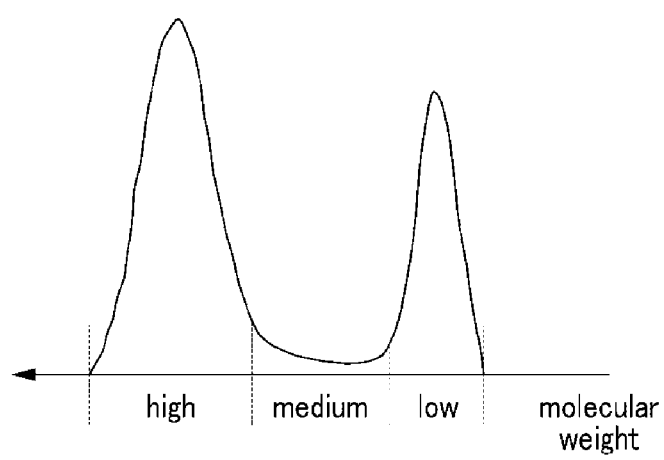
FIG. 4 is a gel permeation chromatography graph of a base resin according to another exemplary embodiment.

In addition, if a tandem type base resin in which a high molecular weight base resin and a low molecular weight base resin are mixed with each other is used, the solubility of the photosensitive resin composition to the developing solution may be even further reduced, and a finer thin film pattern may be formed. For example, the high molecular weight base resin may have a molecular weight of approximately 5000 g/mol or more, the low molecular weight may be approximately 500 g/mol or less, and the medium molecular weight may be approximately 500 to 5000 g/mol. FIGS. 3 and 4 are gel permeation chromatography (GPC) graph of a base resins with different molecular weight distributions. FIG. 3 is a view that illustrates a molecular weight distribution of a normal base resin, and FIG. 4 is a view that illustrates a molecular weight distribution of a tandem type base resin that may be used in the photosensitive resin composition.

Moreover, if the photoacid generator, the photoactive compound, and the hydrophobic phenol-based compound are used together with the tandem type base resin, the solubility of the photosensitive resin composition to the developing solution may be further lowered, and an even finer thin film pattern may be formed.

Referring again to FIG. 2A, the solubility of the photosensitive resin composition to the developing solution at the non-exposure portion of the photosensitive film is reduced as compared to the resin plus PAG alone illustrated in FIG. 2B, but the solubility of the photosensitive resin composition to the developing solution at the exposure portion of the photosensitive film is increased as compared to the resin plus PAG alone illustrated in FIG. 2B.

Use of the photoactive compound PAC with the photoacid generator PAG increases the developing speed of the exposure portion of the photosensitive film. At the exposure portion of the photosensitive film, the photoactive compound PAC is dissolved and a hydrogen ion is generated from the photoacid generator by an exposure process. Thus, the solubility of the photosensitive resin composition to the developing solution at the exposure portion of the photosensitive film may be increased by decomposing the photoactive compound. The solubility of the photosensitive resin composition in which the photoactive compound and the photoacid generator are included may be larger than the solubility of the photosensitive resin composition in which the photoacid generator is included without the photoactive compound.

Next, at the exposure portion of the photosensitive film, the solubility to the developing solution can be rapidly increased by a baking process, and this is because the hydrophobic group of the photoacid generator is separated. This baking process is also called a post exposure baking (PEB) process.

As a difference between the solubility to the developing solution of the non-exposure portion of the photosensitive film and the solubility to the developing solution of the exposure portion of the photosensitive film in the post-exposure baking process is increased, the photosensitive film pattern 20 may have a cross-section shape that is much closer to the rectangular shape, and the thin film may be more finely patterned.

The composition of the photosensitive resin composition will be described in detail.

The photosensitive resin composition includes a base resin, a photoacid generator, a photoactive compound, and a solvent.

The base resin is an alkali soluble resin. For example, the base resin may be a novolac-based resin. In addition, the base resin may be, for example, a tandem type base resin in which a high molecular weight base resin and a low molecular weight base resin are mixed with each other, and the solubility of the non-exposure portion of the photosensitive film to the developing solution may be reduced by the tandem type base resin. The tandem type base resin may have various molecular weight distributions according to required characteristics such as sensitivity, close contacting property, and heat resistance of the photosensitive resin composition. For example, the high molecular weight base resin may be about 50 to about 100 parts by weight, the medium molecular weight base resin may be about 0 to about 50 parts by weight, and the low molecular weight base resin may be about 0 to about 30 parts by weight.

The photoacid generator is a compound that generates an acid when irradiated with light. For example, the photoacid generator may be onium salt, aromatic diazonium salt, sulfonium salt, triarylsulfonium salt, diarylsulfonium salt, monoarylsulfonium salt, iodine salt, diaryliodine salt, nitrobenzyl ester, disulfone, diazo-disulfone, sulfonate, trichloromethyl triazine, N-hydroxysuccinimide triplate, phthalimidotrifluoromethane sulfonate, dinitrobenzyl tosylate, n-desyldisulfone, naphthylimidotrifluoromethane sulfonate, diphenyliodine salt hexafluorophosphate, diphenyliodine salt hexafluorofluoroarcenate, diphenyliodine salt hexafluoroanthymonate, diphenylparamethoxyphenyl triplate, diphenylparatoluenyl triplate, triphenylsulfonium triplate, or dibutylnaphthylsulfonium triplate, and one or more photoacid generators may be used in combination with each other.

The photoactive compound is a compound that is decomposed by light. For example, the photoactive compound may be 2,3,4,4'-tetrahydroxybenzophenone-1,2-naphthoquinonediazide-5-sulfonate, and 2,3,4-trihydroxybenzophenone-1,2-naphthoquinonediazide-5-sulfonate, and one or more photoactive compounds may be used in combination with each other.

The photosensitive resin composition may further include a phenol-based compound having a hydrophobic group, and the solubility of the non-exposure portion of the photosensitive film to the developing solution may be reduced by the phenol-based compound having a hydrophobic group. For example, the phenol-based compound including the hydrophobic group may be a compound represented by the above Formula 1.

One or more organic solvents may be used as the solvent, and the solvent is not particularly limited.

The photosensitive resin composition may include about 100 parts by weight of the base resin, about 0.01 to about 20 parts by weight of the photoacid generator, about 0.1 to about 30 parts by weight of the photoactive compound and about 0.01 to 2 about 0 parts by weight of the phenol-based compound including the hydrophobic group.

When the photoacid generator is used in a range of about 0.01 to about 20 parts by weight and the photoactive compound is used in the range of about 0.1 to about 30 parts by weight, the solubility of the photosensitive resin composition to the developing solution may be reduced. Moreover, when the phenol-based compound including the hydrophobic group is used in the range of about 0.01 to about 20 parts by weight, the solubility of the photosensitive resin composition to the developing solution may be further reduced.

A method for forming a pattern by using the photosensitive resin composition will be described in detail.

With reference to FIG. 1A, the method for forming the pattern includes forming the photosensitive film by coating the photosensitive resin composition on the substrate having the thin film 10.

Next, the method for forming the pattern includes exposing the photosensitive film to light through a mask (not shown), which includes light transmission regions and non-light transmission (i.e., light blocking) regions. The mask and photosensitive film may then be irradiated with, for example, ultraviolet rays. In this case, when the photoacid generator is decomposed by exposure to light at the exposure portion of the photosensitive film, an acid is generated from the photoactive compound.

Next, the method for forming the pattern includes coating a developing solution on the exposed photosensitive film. In this case, the exposure portion of the photosensitive film may be dissolved by the developing solution and removed.

Next, the method for forming the pattern includes baking the photosensitive film. In this case, the exposure portion of the photosensitive film is almost removed, and the non-exposure portion of the photosensitive film is not almost removed, such that the photosensitive film pattern 20 may be formed.

In order to pattern the thin film, the method for forming the pattern may include forming the thin film on the substrate 10, and forming the photosensitive film on the thin film.

A liquid crystal display that includes a finely patterned pixel electrode formed by using the method for patterning thin films using the photosensitive resin composition will be described in detail with reference to FIG. 5 to FIG. 8.

Figure 5:
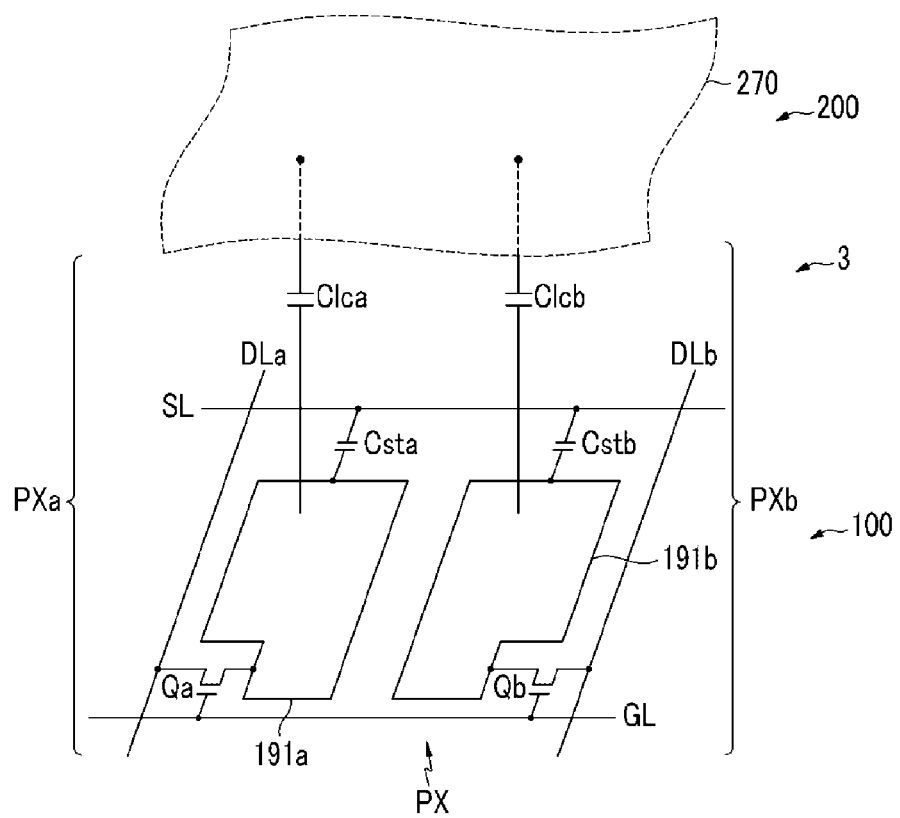
FIG. 5 is an equivalent circuit diagram of a liquid crystal display according to an exemplary embodiment.
Figure 6:
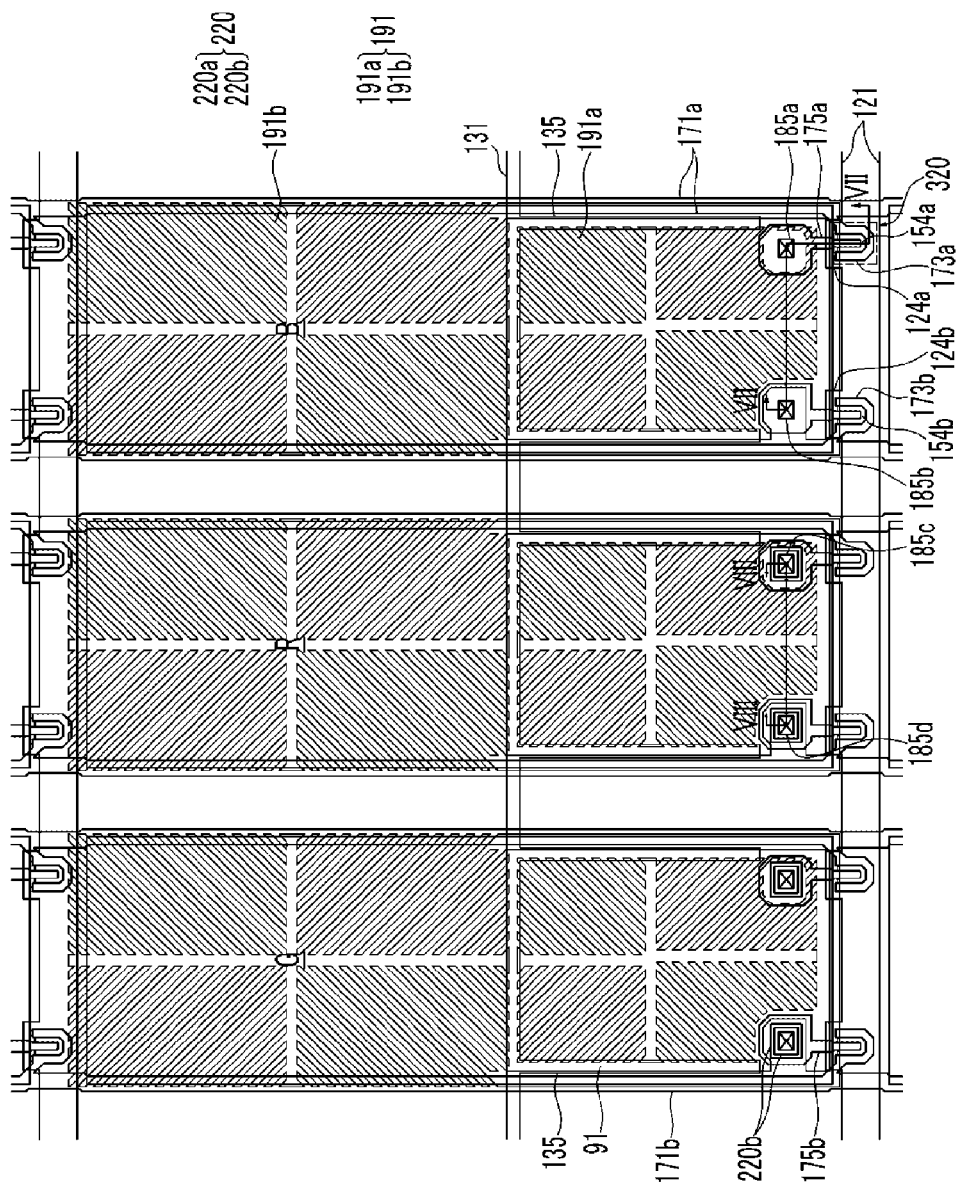
FIG. 6 is a layout view of a liquid crystal display according to an exemplary embodiment.
Figure 7:
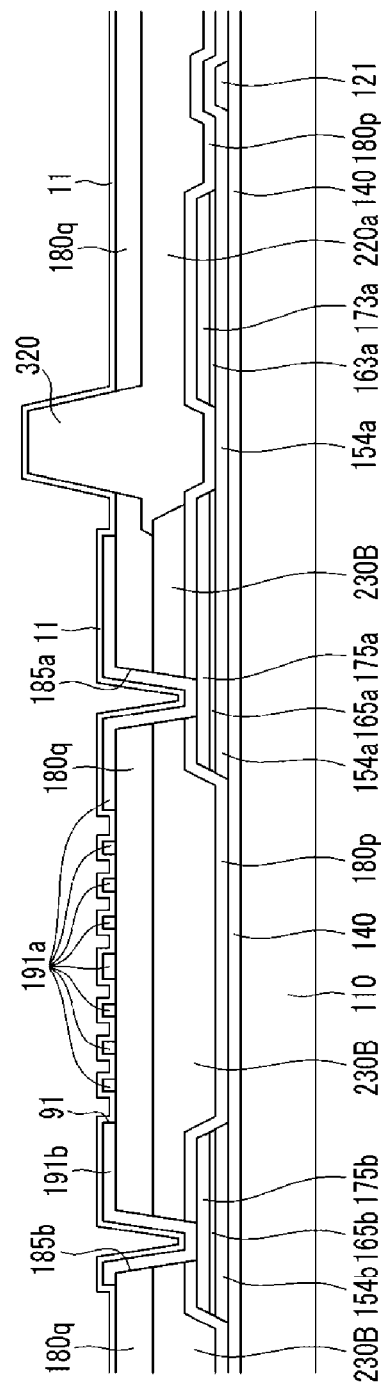
FIG. 7 is a cross-sectional view that is taken along the line VII-VII of the liquid crystal display of FIG. 6.
Figure 8:
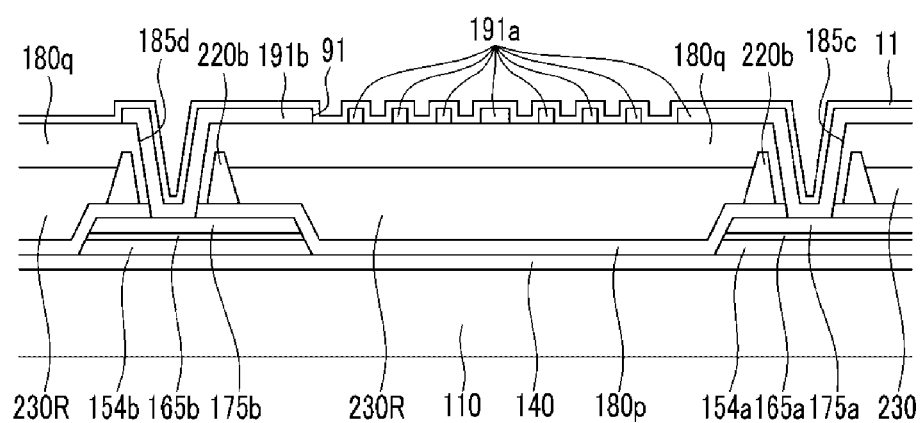
FIG. 8 is a cross-sectional view that is taken along the line VII-VII of the liquid crystal display of FIG. 6. graph illustrating

FIG. 5 is an equivalent circuit diagram of the liquid crystal display according to an exemplary embodiment, FIG. 6 is a layout view of a liquid crystal display according to an exemplary embodiment, FIG. 7 is a cross-sectional view that is taken along the line VII-VII of the liquid crystal display of FIG. 6, and FIG. 8 is a cross-sectional view that is taken along the line VIII-VIII of the liquid crystal display of FIG. 6.

With reference to FIG. 5, the liquid crystal display includes a first display panel 100 and a second display panel 200 facing each other, and a liquid crystal layer 3 disposed between the first display panel 100 and the second display panel 200. The first display panel 100 includes signal lines including a plurality of gate lines GL, a plurality pairs of data lines DLa and DLb and a plurality of storage electrode lines SL, and a plurality of pixels PX connected thereto.

A pixel PX includes a pair of subpixels PXa and PXb, and the subpixels PXa and PXb include switching elements Qa and Qb, liquid crystal capacitors Clca and Clcb and storage capacitors Csta and Cstb.

The switching elements Qa and Qb are a thin film transistor that are provided on the first display panel 100, and a control terminal thereof is connected to the gate line GL, an input terminal is connected to the data lines DLa and DLb, and an output terminal is connected to the liquid crystal capacitors Clca and Clcb and the storage capacitors Csta and Cstb.

The liquid crystal capacitors Clca and Clcb have subpixel electrodes 191a and 191b and a common electrode 270 as two terminals, and a liquid crystal layer 3 between the two terminals is used as a dielectric material.

The storage capacitors Csta and Cstb, which act as an auxiliary capacitor of the liquid crystal capacitors Clca and Clcb, are formed by overlapping the storage electrode line SL provided on the first display panel 100 and the subpixel electrodes 191a and 191b with an insulator disposed therebetween, and a predetermined voltage such as a common voltage Vcom is applied to the storage electrode line SL.

With reference to FIG. 6 to FIG. 7, a plurality of gate lines 121 and a plurality of storage electrode lines 131 and 135 are formed on an insulation substrate 110 made of glass and plastic. A gate line 121 transfers a gate signal and extends in a row direction. Each gate line 121 includes a plurality of first and second gate electrodes 124a and 124b protruding upward from the gate line 121 in a plan view.

The storage electrode lines 131 and 135 include a branch line 131 that extends substantially parallel to the gate line 121 and a plurality of storage electrodes 135 extending therefrom. The shape and disposition of the branch line 131 and the storage electrode 135 may be variously changed. The storage electrode line 131 and the storage electrode 135 may also be omitted.

A gate insulating layer 140 is formed on the gate line 121 and the storage electrode lines 131 and 135. The gate insulating layer 140 may include silicon nitride (SiNx) or silicon oxide (SiO$_2$).

A plurality of semiconductors 154a and 154b including hydrogenated amorphous silicon (amorphous silicon is abbreviated to a-Si) or polysilicon are formed on the gate insulating layer 140.

A plurality pairs of ohmic contacts 163a, 165a, and 165b are formed on the semiconductors 154a and 154b, and the ohmic contacts 163a, 165a, and 165b may include a material such as n+ hydrogenated amorphous silicon where metal silicide or n-type impurity is doped in a high concentration.

A plurality pairs of data lines 171a and 171b and a plurality pairs of first and second drain electrodes 175a and 175b are formed on the ohmic contacts 163a, 165a, and 165b and the gate insulating layer 140. In addition, a storage voltage supply line (not shown) is formed on the same layer as the data lines 171a and 171b around a peripheral area. The storage voltage supply line is formed in an approximately column direction, and a plurality of storage electrode lines 131 are electrically connected thereto.

The data lines 171a and 171b extend in a column direction and cross branch lines 131 and the gate line 121. The data lines 171a and 171b extend toward the first and the second gate electrodes 124a and 124b and include first and second source electrodes 173a and 173b, which are bent in a U-shape, and the first and the second source electrodes 173a and 173b face the first and the second drain electrodes 175a and 175b on the first and the second gate electrodes 124a and 124b.

The first and the second gate electrodes 124a and 124b, the first and the second source electrodes 173a and 173b and the first and the second drain electrodes 175a and 175b form first and second thin film transistors Qa and Qb in conjunction with the first and the second semiconductors 154a and 154b. The channels of the thin film transistors Qa and Qb are formed in the first and the second semiconductors 154a and 154b between the first and the second source electrodes 173a and 173b and the first and the second drain electrodes 175a and 175b. The first and the second drain electrodes 175a and 175b are each connected to pixel electrodes 191a and 191b of the liquid crystal display to apply a driving voltage.

The ohmic contacts 163a, 165a, and 165b exist between the semiconductors 154a and 154b therebelow and the data lines 171a and 171b and the drain electrodes 175a and 175b thereon, and reduce contact resistance therebetween.

With the exception of channel portions of the first and the second semiconductors 154a and 154b, plane shapes of three layers of the first and the second semiconductors 154a and 154b, the ohmic contacts 163a, 165a, and 165b, the data lines 171a and 171b including the first and the second source electrodes 173a and 173b, and the first and the second drain electrodes 175a and 175b are substantially the same as each other. In this case, the three layers are formed by using one mask. However, the first and the second semiconductors 154a and 154b, and the ohmic contacts 163a, 165a, and 165b may be an island type. The shape of the three layers may be variously changed.

The lower layer 180p including silicon nitride, and silicon oxide is formed on the data lines 171a and 171b, the drain electrodes 175a and 175b and the exposed semiconductors 154a and 154b.

A blue color filter 230B, a green color filter 230G and a red color filter 230R are formed on the lower layer 180p. Each color filter 230B, 230G, and 230R may have a band shape. In addition, because each color filter 230B, 230G, and 230R may be printed by an inkjet process, processability is excellent.

An upper layer 180q is formed on each color filter 230B, 230G, and 230R. The upper layer 180q may include silicon oxide, silicon nitride, and photosensitive organic materials. The upper layer 180q serves to planarize the thin film transistor array panel.

Light blocking members 220a and 220b are formed between the lower layer 180p and the upper layer 180q. The light blocking members 220a and 220b extend in an approximate column direction parallel to the data lines 171a and 171b, and include a protruding part 220b covering the first and the second thin film transistors Qa and Qb. The light blocking member 220 may prevent light leakage by covering each color filter 230B, 230G, and 230R.

A spacer 320 is formed on the same layer as the light blocking member 220 between the lower layer 180p and the upper layer 180q. However, the spacer 320 may be formed on the other layer in respects to a different layer from the light blocking member 220. The spacer 320 serves to maintain a gap of the liquid crystal layer 3, and may be a column spacer (columnar spacer) 320. The column spacer 320 may be positioned between the first and the second thin film transistors Qa and Qb.

The light blocking member 220 and the column spacer 320 may include the same material, and may be formed in different thicknesses by using a halftone mask. Besides, the disposition and the shape of the column spacer 320 may be variously changed.

A plurality of pixel electrodes 191 are formed on the upper layer 180q. A plurality of pixel electrodes 191 may include the same material such as ITO, and IZO, and may be formed in the same process.

Each pixel electrode 191 includes first and second subpixel electrodes 191a and 191b separated from each other with a gap 91 disposed therebetween.

The whole shape of the first and the second subpixel electrodes 191a and 191b is a quadrangle. An area occupied by the second subpixel electrode 191b in the whole pixel electrode 191 may be larger than an area occupied by the first subpixel electrode 191a. Each of the first and the second subpixel electrodes 191a and 191b includes a main branch and a subbranch. The main branch is approximately parallel to the gate line 121 or the data line 171. The subbranch is a fine branch having a comb shape.

The width of the subbranch patterned by using the photosensitive resin composition may be approximately 2 μm or less, and an interval between the subbranches may be approximately 2 μm or less. In the case where the width of the subbranch is approximately 2 μm or less, transmittance of the display device may be improved. For example, in the case where the thickness of the liquid crystal layer is approximately 2.9 μm, the transmittance of the display device may be about 88% when the width of the subbranch is approximately 3 μm, and the transmittance of the display device may be about 95% when the width of the subbranch is approximately 2 μm.

The first and the second pixel electrodes 191a and 191b are physically and electrically connected to the first and the second drain electrodes 175a and 175b through contact holes 185a and 185b and receive the data voltage from the first and the second drain electrodes 175a and 175b.

A lower alignment layer 11 is formed on the plurality of pixel electrodes 191.

The second display panel 200 includes a common electrode 270 that is not patterned.

A liquid crystal layer 3 may include a reactive mesogen and a liquid crystal molecule is disposed between the first display panel 100 and the second display panel 200.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the disclosure, including the appended claims.

What is claimed is:
1. A method for forming a pattern, the method comprising:
 forming a photosensitive film by coating a photosensitive resin composition on a substrate;
 exposing the photosensitive film to light through a mask, the mask including a light transmission region and a non-light transmission region;

developing the photosensitive film exposed to light through the mask using a developing solution; and forming a photosensitive film pattern by baking the photosensitive film developed by the developing solution, wherein the photosensitive resin composition includes an alkali soluble base resin, a photoacid generator and a photoactive compound, wherein the alkali soluble base resin is a tandem type resin and wherein the tandem type resin includes a mixture of a high molecular weight resin with a molecular weight of 5000 g/mol or more, a low molecular weight resin with a molecular weight of 500 g/mol or less, and a medium molecular weight resin with a molecular weight between 500 g/mol and 5000 g/mol, and the alkali soluble base resin is about 100 parts by weight, the photoacid generator is about 0.01 to about 20 parts by weight, and the photoactive compound is about 0.1 to about 30 parts by weight.

2. The method of claim 1, wherein:
the photosensitive film pattern has a substantially rectangular cross-section.

3. The method of claim 1, further comprising:
forming a thin film on the substrate.

4. The method of claim 3, wherein:
the thin film is a pixel electrode of a liquid crystal display, and the pixel electrode includes a fine branch electrode.

5. The method of claim 4, wherein:
a width of the fine branch electrode is about 2 μm or less.

6. The method of claim 1, wherein:
the photosensitive resin composition further includes a phenol-based compound including a hydrophobic group.

7. The method of claim 6, wherein:
the phenol-based compound is a compound represented by the following Formula 1:

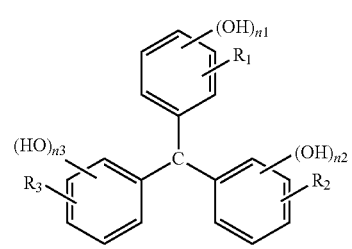

[Formula 1]

wherein $R_1$ to $R_3$ are independently a substituted or unsubstituted $C_1$-$C_{10}$ alkyl group, and n1 to n3 are independently an integer of 1 to 5.

8. The method of claim 6, wherein:
the alkali soluble base resin is about 100 parts by weight, the photoacid generator is about 0.01 to about 20 parts by weight, the photoactive compound is about 0.1 to about 30 parts by weight and the phenol-based compound is about 0.01 to about 20 parts by weight.

* * * * *